(12) United States Patent
Aga et al.

(10) Patent No.: US 9,378,999 B2
(45) Date of Patent: Jun. 28, 2016

(54) METHOD FOR MANUFACTURING SOI WAFER

(71) Applicant: SHIN-ETSU HANDOTAI CO., LTD., Tokyo (JP)

(72) Inventors: Hiroji Aga, Takasaki (JP); Toru Ishizuka, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 14/427,151

(22) PCT Filed: Oct. 11, 2013

(86) PCT No.: PCT/JP2013/006072
§ 371 (c)(1),
(2) Date: Mar. 10, 2015

(87) PCT Pub. No.: WO2014/080563
PCT Pub. Date: May 30, 2014

(65) Prior Publication Data
US 2015/0243550 A1     Aug. 27, 2015

(30) Foreign Application Priority Data

Nov. 21, 2012 (JP) ................................. 2012-255719

(51) Int. Cl.
*H01L 21/46* (2006.01)
*H01L 21/762* (2006.01)
(Continued)

(52) U.S. Cl.
CPC .... *H01L 21/76254* (2013.01); *H01L 21/02238* (2013.01); *H01L 21/26506* (2013.01); *H01L 21/31111* (2013.01); *H01L 21/02255* (2013.01)

(58) Field of Classification Search
CPC ................... H01L 21/76254; H01L 21/02238; H01L 21/26506
USPC ......................................................... 438/458
See application file for complete search history.

(56) References Cited

U.S. PATENT DOCUMENTS

2003/0234075 A1  12/2003  Aspar et al.
2008/0132032 A1   6/2008  Tomita et al.
(Continued)

FOREIGN PATENT DOCUMENTS

JP   H03-55822 A    3/1991
JP   H03-250615 A  11/1991
(Continued)

OTHER PUBLICATIONS

Jan. 21, 2014 International Search Report issued in International Patent Application No. PCT/JP2013/006072.
Jun. 4, 2015 Interntaional Preliminary Report on Patentability issued in International Patent Application No. PCT/JP2013/006072.

*Primary Examiner* — Bradley K Smith
(74) *Attorney, Agent, or Firm* — Oliff PLC

(57) ABSTRACT

A method for manufacturing SOI wafer of forming an oxide film on a bond wafer of a semiconductor single crystal substrate, forming an ion implanted layer into the bond wafer by implanting ions of at least one kind of gas in hydrogen and rare gases through the oxide film, bonding together an ion implanted front surface of the bond wafer and base wafer front surface via the oxide film, thereafter delaminating the bond wafer along the ion implanted layer, and thereby fabricating an SOI wafer. The oxide film is formed on the bond wafer such that on a back surface it is made thicker than the oxide film on a bonded face. The method for manufacturing SOI wafer capable of suppressing scratches and SOI film thickness abnormality caused by warped shapes of the SOI and bond wafers after delamination where it has been delaminated by an ion implantation delamination method.

18 Claims, 3 Drawing Sheets

(51) Int. Cl.
*H01L 21/02* (2006.01)
*H01L 21/265* (2006.01)
*H01L 21/311* (2006.01)

(56) References Cited

U.S. PATENT DOCUMENTS

2008/0315349 A1* 12/2008 Takei .................... H01L 21/187
257/506

2009/0325385 A1    12/2009  Tomita et al.

FOREIGN PATENT DOCUMENTS

| | | |
|---|---|---|
| JP | H11-26336 A | 1/1999 |
| JP | 2004-503111 A | 1/2004 |
| JP | 2006-270039 A | 10/2006 |
| JP | 2008-140878 A | 6/2008 |
| JP | 2011-187502 A | 9/2011 |
| WO | 2012/012138 A2 | 1/2012 |

* cited by examiner

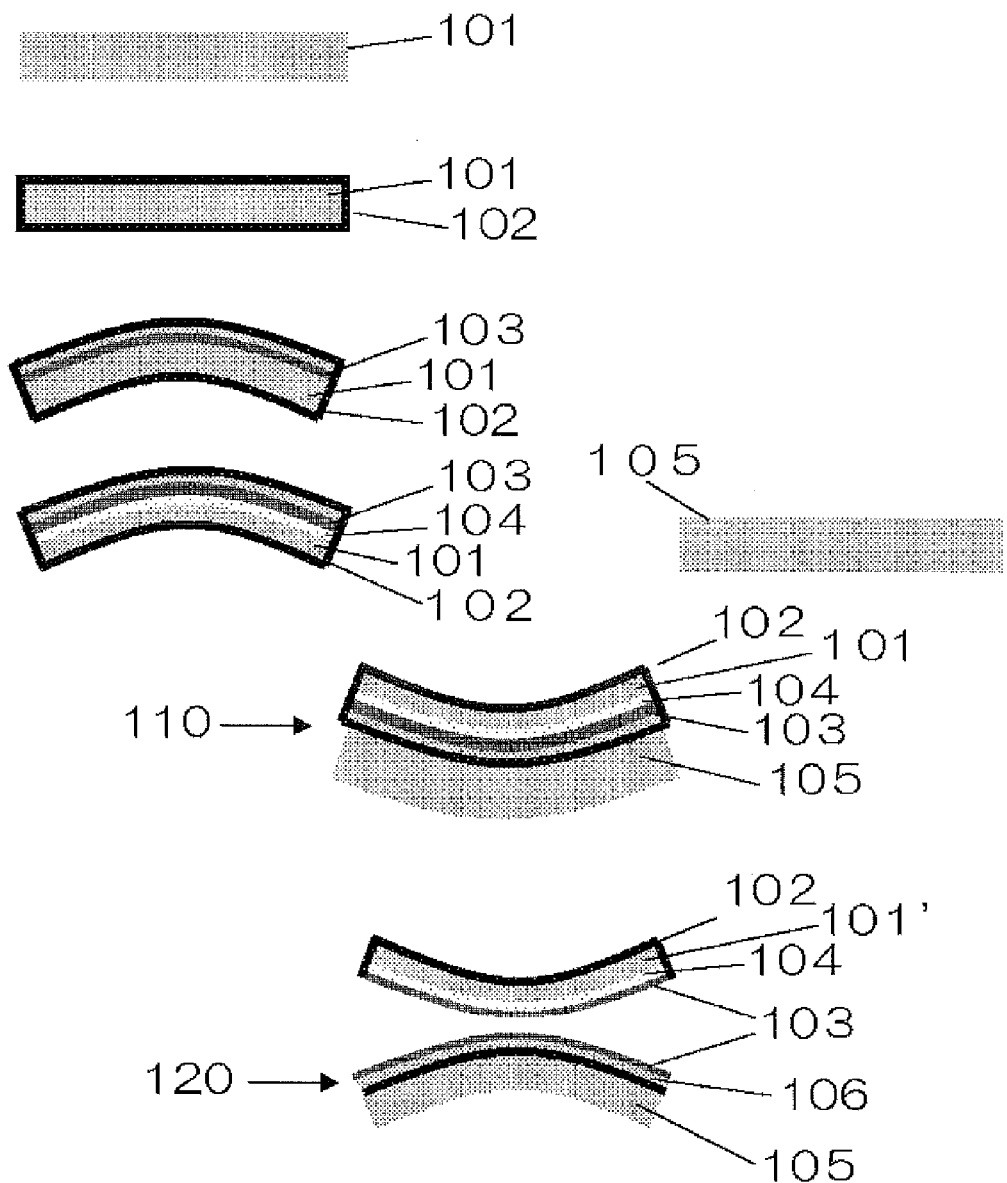

METHOD FOR MANUFACTURING SOI WAFER

TECHNICAL FIELD

The present invention relates to a method for manufacturing an SOI wafer by an ion implantation delamination method.

BACKGROUND ART

In fabrication of the SOI wafer by the ion implantation delamination method, when a bond wafer that forms an SOI layer (Silicon On Insulator layer, in a broad sense, Semiconductor On Insulator) and a base wafer have been bonded together via an oxide film and thereafter it has been delaminated by performing heat treatment on an ion implanted layer, an SOI layer front surface (a delaminating plane) of the SOI wafer after delamination and a front surface (a delaminating plane) of the bond wafer after delamination mutually face. Therefore, there were cases where contact took place between the wafers depending on shapes of warps of the SOI wafer after delamination and the bond wafer after delamination and scratches and SOI film thickness abnormality were generated.

Against the problem, there was a method for fabricating the SOI wafer by forming an oxide film on the entire surface of the bond wafer and bonding it with the base wafer. In this method, since while the SOI wafer warps into a convex shape by a buried oxide film transferred from a front surface of the bond wafer, the bond wafer after delamination has no oxide film on a bonded face and warps into a concave shape reversely to the SOI wafer by the oxide film remained on a back surface, and the magnitudes of warps become the same as each other between the SOI wafer and the bond wafer after delamination, occurrence of contact between the wafers can be made difficult theoretically. However, since in reality, also the influence of a warped shape when processing the wafer still remains, for example, in a case where the wafer shape when processing the bond wafer is the convex shape, the bond wafer after delamination turns to a shape that the convex shape upon wafer processing has been taken off from the concave shape caused by the influence of the back surface oxide film. At this time, there are cases where mismatching occurs between the warped shapes of the SOI wafer and the bond wafer after delamination and the magnitude of the warp of the concave shape of the bond wafer after delamination becomes small in comparison with the magnitude of the warp of the convex shape of the SOI wafer. In such a case, at a tip part of the convex shape of the SOI wafer, contact with the bond wafer after delamination took place and the scratches and the SOI film thickness abnormality were generated.

Among them, generation of the SOI film thickness abnormality is induced because formation of a natural oxide film on the front surface of the SOI wafer is obstructed by contact of the SOI wafer with the bond wafer and the natural oxide film on a contact part becomes thin. That is, in SC1 cleaning (cleaning with an $NH_4OH/H_2O_2$ solution) of RCA cleaning of the next process, the oxide film is early removed from a part which is thin in oxide film of the wafer contact part and an Si front surface of an SOI layer is exposed, and etching of Si with SC1 is started relatively in early stage. As a result, after SC1 cleaning, a thin film part is formed in the film thickness of the SOI by the part which was thin in the oxide film (the wafer contact part).

In addition, as an ion implantation method for forming an ion implanted layer which would induce delamination, there is an ion implantation delamination method which is performed by implanting two kinds of, for example, hydrogen ions and helium ions, performed by so-called co-implantation. In this method, as shown in FIG. 4, when a bond wafer 101 (for example, a warped shape: 60 μm convex) that an oxide film 102 (for example, 27 nm) has been formed and a helium ion implanted layer 104 has been set at a position deeper than that of a hydrogen ion implanted layer 103 and a base wafer 105 are bonded together via the oxide film 102 so as to form a bonded wafer 110, although the hydrogen ion implanted layer 103 is divided into parts on the side of an SOI wafer 120 having an SOI layer 106 and on the side of a bond wafer 101' after delamination in a delaminating process, the helium ion implanted layer 104 remains in the bond wafer 101' after delamination still after delamination. In this case, due to presence of the helium ion implanted layer 104, a force warping toward the convex side works on the bond wafer 101' after delamination and mismatching in warped shape between the bond wafer 101' (for example, 40 μm convex) after delamination and the SOI wafer 120 (for example, 20 μm convex) occurs. Therefore, in the method for manufacturing SOI wafer by the ion implantation delamination method utilizing co-implantation, there were cases where contact with the bond wafer after delamination occurred at the convex shape tip part of the SOI wafer and the scratches and the SOI film thickness abnormality were generated.

CITATION LIST

Patent Literature

Patent Document 1: Japanese Unexamined Patent publication (Kokai) No. 2008-140878
Patent Document 2: Japanese Unexamined Patent publication (Kokai) No. H03-55822

SUMMARY OF INVENTION

Technical Problem

As a technology for solving the warp of the bonded SOI wafer, methods for imparting a concave warp to the base wafer are disclosed in Patent Literatures 1, 2. However, in fabrication of the bonded SOI wafer by the ion implantation delamination method, there has been required a technology for solving mismatching in warped shape between the bond wafer after delamination and the SOI wafer, taking the influence of the warped shape of the bond wafer before bonding into account.

The present invention has been made in view of the problem and provides a method for manufacturing SOI wafer capable of suppressing the scratches and the SOI film thickness abnormality caused by the warped shapes of the SOI wafer and the bond wafer after delamination which would generate when it has been delaminated by the ion implantation delamination method.

Solution to Problem

In order to solve the problem, the present invention,
in a method for manufacturing SOI wafer of forming an oxide film on a bond wafer consisting of a semiconductor single crystal substrate, forming an ion implanted layer into the bond wafer by implanting ions of at least one kind of gas in hydrogen and rare gases through the oxide film, bonding together an ion implanted front surface of the bond wafer and a base wafer front surface via the oxide film, thereafter delaminating the bond wafer along the ion implanted layer, and thereby fabricating an SOI wafer, provides the method for manufacturing SOI wafer of a feature that the oxide film to be formed on the bond wafer is made such that the oxide film on a back surface is made thicker than the oxide film on a bonded face.

By the method for manufacturing SOI wafer using the bond wafer that the oxide film on the back surface is thicker than the oxide film on the bonded face like this, the bond wafer after delamination is formed into the concave shape by a film thickness difference between the oxide films and therefore generation of the scratches and the SOI film thickness abnormality caused by contact can be suppressed by preventing mismatching in warped shape between the SOI wafer and the bond wafer after delamination.

In this occasion, it is preferable that formation of the oxide film on the bond wafer be performed by forming a thermal oxide film on the entire surface of the bond wafer, thereafter fabricating the bond wafer having the thermal oxide film only on the back surface by removing the thermal oxide on the bonded face side of the bond wafer, and thermally oxidizing the entire surface of the bond wafer having the thermal oxide film only on the back surface.

The film thickness difference between the oxide film on the bonded face and the oxide film on the back surface can be appropriately set by forming the oxide film of the bond wafer by the method like this.

Further, it is preferable that a process of polishing the bonded face side after the thermal oxide film on the bonded face side of the bond wafer has been removed be included, and thereafter thermal oxidation of the entire surface be performed.

Defects when bonding can be suppressed by polishing the bonded faces in this way.

In addition, it is preferable that as the bond wafer, a wafer which has been fabricated by reclaiming the bond wafer after delamination along the ion implanted layer be used.

The SOI wafer can be economically manufactured by using the reclaimed wafer as the bond wafer in this way.

Furthermore, it is preferable that in the reclaiming, the back surface oxide film of the bond wafer after delamination be not removed.

Formation of the film thickness difference between the oxide films of the bond wafer can be easily performed by using the wafer reclaimed in this way.

In addition, it is preferable that as the ion implantation, co-implantation of hydrogen ions and helium ions be performed, and in the co-implantation, the helium ions be implanted into a position deeper than that of the hydrogen ions.

By the method for manufacturing SOI wafer in the present invention, mismatching in warped shape between the SOI wafer and the bond wafer after delamination can be prevented by eliminating the influence of the warp on the bond wafer after delamination due to presence of the helium ion implanted layer.

Advantageous Effects of Invention

As described above, according to the present invention, in fabrication of the SOI wafer by the ion implantation delamination method, generation of the scratches and the SOI film thickness distribution abnormality of the SOI wafer caused by contact between the bond wafer after delamination and the SOI wafer can be suppressed upon delamination.

BRIEF DESCRIPTION OF DRAWINGS

FIG. 4 is a flow chart showing one example of a conventional method for manufacturing SOI wafer using co-implantation.

DESCRIPTION OF EMBODIMENTS

Figure 1:
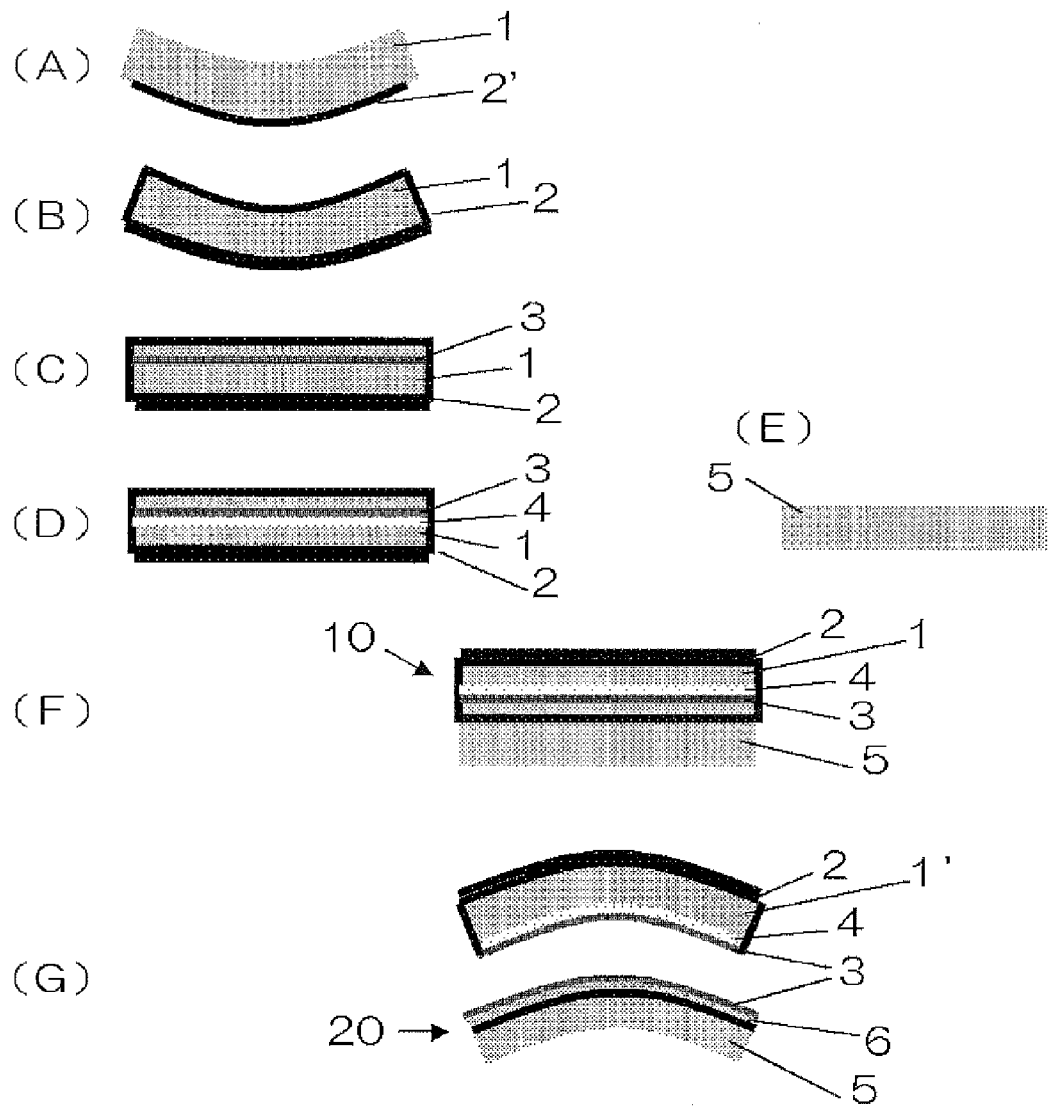
FIG. 1 is a flow chart showing one example of a method for manufacturing SOI wafer of the present invention.

The inventors of the present invention have found that there are cases where in fabrication of the SOI wafer by the ion implantation delamination method, when the magnitude of the concave shape of the bond wafer after delamination is smaller than the magnitude of the convex shape of the SOI, mismatching in warped shape between the bond wafer after delamination and the SOI wafer occurs, it comes into contact with the bond wafer after delamination at the tip of the convex on the front surface of the SOI layer and the scratches and the SOI film thickness abnormality are generated on the central part of the SOI wafer in a process of heat treatment for delamination.

In a case where the bonded SOI wafer is to be fabricated by forming a thermal oxide film on the bond wafer, the SOI wafer after delamination warps into the convex shape toward the SOI layer side in proportion to the thickness of a buried oxide film. On the other hand, with regard to the bond wafer after delamination, the oxide film on the back surface acts because the oxide film on the front surface is removed and a delaminating plane warps into the concave shape.

In general, since the thicknesses of the oxide films acting on the warps are the same as each other, the magnitude of the convex shape of the SOI wafer and the magnitude of the concave shape of the delaminated bond wafer become the same as each other and the tip part of the convex of the SOI wafer does not come into contact with the bond wafer after delamination. However, in a case where the convex shape or the concave shape is formed in a wafer fabricating process for the original bond wafer, there are cases where the concave shape of the bond wafer after delamination and the convex shape of the SOI have different magnitudes, the tip part of the convex of the SOI wafer comes into contact with the bond wafer after delaminated in heat treatment for delamination and the scratches and the film thickness abnormality are generated on the central part of the SOI wafer.

In addition, in a delamination method by co-implantation of hydrogen ions and helium ions, in a case where a helium ion implanted layer has been set at a position deeper than that of a hydrogen ion implanted layer, since delamination occurs in the hydrogen ion implanted layer, while the hydrogen ion implanted layer is divided into parts on the SOI layer side and the bond wafer after delamination, the helium ion implanted layer remains in the bond wafer after delamination. In this case, the force warping toward the convex side works on the bond wafer after delamination due to the presence of the helium ion implanted layer, the magnitude of the concave shape of the bond wafer after delamination is liable to become smaller than the magnitude of the convex shape of the SOI wafer and mismatching in warped shape is liable to occur. Therefore, in co-implantation of hydrogen ions and helium ions, contact with the bond wafer after delamination occurs at the tip part of the convex shape of the SOI wafer and the scratches and the SOI film thickness abnormality are liable to generate.

Accordingly, the inventors of the present invention have achieved the present invention by using the bond wafer that has been formed into the concave shape in advance by forming the oxide film on the back surface thicker than the oxide film on the bonded face when bonding is to be performed in manufacture of the SOI wafer as a method for surely making the magnitude of the concave shape of the bond wafer after delamination larger than the convex shape of the SOI wafer.

That is, the present invention is, in a method for manufacturing SOI wafer of forming an oxide film on a bond wafer consisting of a semiconductor single crystal substrate, forming an ion implanted layer into the bond wafer by implanting ions of at least one kind of gas in hydrogen and rare gases through the oxide film, bonding together an ion implanted front surface of the bond wafer and a base wafer front surface via the oxide film, thereafter delaminating the bond wafer along the ion implanted layer, and thereby fabricating an SOI wafer, the method for manufacturing SOI wafer that the oxide film to be formed on the bond wafer is made such that the oxide film on a back surface is made thicker than the oxide film on a bonded face.

Although in the following, as one example of embodiments, the present invention will be described in detail with reference to the drawings, the present invention is not limited to this.

FIG. 1 is a flow chart of a method for manufacturing SC1 wafer of the present invention.

First, an oxide film 2' on a back surface is formed on a bond wafer 1 (FIG. 1(A)). A thermal oxide film is preferable as the oxide film on the back surface like this, and as a formation method thereof, a method for forming the thermal oxide film on the entire surface of the bond wafer and thereafter removing the thermal oxide film on the bonded face side of the bond wafer, thereby fabricating the bond wafer having the thermal oxide film only on the back surface is preferable.

As other examples of the method for forming this oxide film on the back surface, a method for forming the thermal oxide film of an almost uniform thickness on the entire surface of the bond wafer and thereafter bringing the oxide film into contact with an etching liquid in a state that the oxide film on the back surface has been protected by using ring-shaped rubber (an O-ring) or a protection sheet made of PVC and so forth and a method for removing the thermal oxide film on the bonded face side with an HF solution using spin etching and so forth and leaving only the oxide film on the back surface may be given.

Incidentally, although as a semiconductor single crystal substrate used as the bond wafer, it is preferable to use a silicon single crystal wafer, a germanium single crystal wafer, a germanium epitaxial wafer, an SiGe epitaxial wafer, a strained silicon wafer, an SiC single crystal wafer may be also used in addition to it.

Next, further an oxide film 2 is formed on the bond wafer 1 with the oxide film 2' on the back surface formed (FIG. 1(B)). The thermal oxide film is preferable as the oxide film like this and as a formation method thereof, a method for thermally oxidizing the entire surface of the bond wafer with the oxide film on the back surface formed is preferable.

In addition, in a case where a defect when bonding them occurs due to deterioration of surface roughness of the bonded face of the bond wafer and adhesion of particles thereto caused by formation of the oxide film on the back surface and removal of the oxide film on the bonded face side, a process of polishing the bonded face side by CMP and so forth may be included after the oxide film on the bonded face side has been removed and thereafter thermal oxidation of the entire surface may be performed (between (A) and (B) of FIG. 1).

The bond wafer in which the oxide film on the back surface is thicker than the oxide film on the bonded face is fabricated by the above-illustrated method. In the bond wafer like this, the concave shape can be formed in advance before bonding it to the base wafer, and excessive warping can be suppressed regardless of formation of the later described helium ion implanted layer.

Incidentally, with respect to what extent the oxide film on the back surface is to be formed thicker than the oxide film on the bonded face, it can be appropriately set by experimentations and calculations so as to prevent mismatching directly after delamination (so as to make the magnitude of the convex shape of the SOI wafer and the magnitude of the concave shape of the bond wafer after delamination the same as each other) on the basis of specifications (a diameter, a base wafer thickness, a BOX layer thickness and so forth) of the SOI wafer to be manufactured and specifications (a diameter, a wafer thickness and so forth) of the bond wafer to be used.

Next, ions are implanted into the bonded face side of the bond wafer 1 with the formed oxide film 2, and an ion implanted layer is formed (FIG. 1(C)). Although as the ion implanted layer like this, the one that is formed by implanting ions of at least one kind of gas in hydrogen and rare gases can be given, a hydrogen ion implanted layer formed by implanting hydrogen ions and a co-implanted layer formed by implanting both of hydrogen ions and helium ions are preferable, in particular.

In a case where co-implantation using hydrogen ions and helium ions is to be performed as this ion implantation, it is preferable to first implant hydrogen ions so as to form a hydrogen ion implanted layer 3 and then to implant helium ions into a position deeper than that of the hydrogen ion implanted layer 3 so as to form a helium ion implanted layer 4 as shown in FIG. 1(D). If co-implantation is performed in this way, the amount of ions to be implanted can be reduced in comparison with a case of single implantation of ions of one kind.

In this case, in the conventional method for manufacturing SOI wafer, when hydrogen ions and helium ions are co-implanted as shown in FIG. 4, the bond wafer 101' after delamination turned to the convex shape due to presence of the helium ion implanted layer 104, mismatching in warped shape between it and the SOI wafer 120 occurred and the scratches and the SOI film thickness abnormality were generated. However, in the method for manufacturing SOI wafer of the present invention, since the warped shape of the bond wafer can be set in advance before bonding by making the oxide film on the back surface thick as aforementioned, the influence of presence of the helium ion implanted layer can be minimized.

Next, at room temperature of, for example, about 20 to 30° C., the ion-implanted front surface of the bond wafer 1 and a front surface of a base wafer 5 are bonded together via the oxide film 2 so as to form a bonded wafer 10 (FIG. 1 (E), (F)). In this case, it is also possible to improve the bonding strength at the room temperature by performing plasma treatment on the bonded face of at least one of the bond wafer and the base wafer before bonding.

Incidentally, as the base wafer, a silicon single crystal wafer or a silicon single crystal wafer with an insulating film formed on a front surface and so forth can be used.

Then, an SOI wafer 20 having an SOI layer 6 is formed by delaminating the bond wafer 1 from the bonded wafer 10 along the ion implanted layer (the hydrogen ion implanted layer 3) by heat treatment for delamination at, for example, at least 400° C. so as to make it as a bond wafer 1' after delamination (FIG. 1(G)). At this time, in the present invention, the bond wafer 1' after delamination surely warps into the concave shape and contact due to mismatching in shape between the bond wafer after delamination and the SOI wafer as conventionally done can be prevented.

In addition, that the bond wafer after delamination can be reused is one of the features of the method for manufacturing SOI wafer using the ion implantation delamination method. Therefore, also in the present invention, the wafer that has been fabricated by reclaiming the bond wafer 1' after delamination can be used. In this case, when the bond wafer after delamination is to be reclaimed, the bond wafer with the oxide film attached onto the back surface is fabricated by reclaiming it without removing the oxide film on the back surface and it is thermally oxidized, thereby the bond wafer that the oxide film on the back surface is thicker than the oxide film on the bonded face can be fabricated.

In this occasion, although with respect to removal of the oxide film remained on an outer peripheral non-bonding part on the bonded face side in reclaiming the bond wafer after delamination, it can be attained by directly polishing the bonded face side, it can be also performed by using a method for bringing the oxide film into contact with the etching liquid in a state that the oxide film on the back surface has been protected by using the ring-shaped rubber (the O-ring) or the protection sheet made of PVC and so forth and a spin etching machine.

Protection of the back surface oxide film when the bond wafer after delamination is to be reclaimed may be made by performing treatment of blocking the etching liquid and an etching gas by the O-ring as mentioned above, may be made by attaching the protection sheet made of PVC and so forth onto the back surface of the bond wafer after delamination, and may be made by preventing the etching liquid and the etching gas from going around to the bond wafer back surface by centrifugal force and wind pressure by rotation of the wafer. As the etching liquid for the oxide film, the HF solution is preferable. In addition, it may be etched with HF gas. Although it is desirable to set the O-ring at a position of about several mm from the outer periphery such that warping is generated on the bond wafer after etching, it may be set on the further inner side depending on an allowable warping level.

As described above, the contact between the bond wafer after delamination and the SOI wafer is suppressed and the scratches and the film thickness abnormality of the SOI wafer can be suppressed by surely deforming the shape of the bond wafer upon delamination into the concave shape by making the oxide film of the bond wafer to be bonded to the base wafer such that the oxide film on the back surface is thicker than the oxide film on the bonded face.

EXAMPLE

Example 1

Thermal oxidation was performed on a bond wafer consisting of a silicon single crystal wafer of 300 mm in diameter the both surfaces of which had been mirror-polished to form a thermal oxide film (an initial oxide film) of 150 nm on the entire surface, it was immersed in the HF aqueous solution in a state that the oxide film on the back surface of the bond wafer had been protected by the O-ring to remove the oxide film on the bonded face side, then after reprocessing of the front surface had been performed by CMP processing, thermal oxidation was again performed to form a thermal oxide film (a buried oxide film) of 30 nm on the bonded face side, after ion implantation of hydrogen had been performed, it was bonded with a base wafer consisting of a silicon single crystal wafer of 300 mm in diameter, it was delaminated by heat treatment for delamination in a horizontal heat treatment furnace, and thereby 10 SOI wafers were fabricated.

Example 2

The bond wafer (with the oxide film of 155 nm on the back surface) after delamination obtained in the example 1 was immersed in the HF aqueous solution in a state that the oxide film (the initial oxide film) on the back surface had been protected by the O-ring to remove the oxide film on the bonded face side, then after reclaiming had been performed by CMP processing, a thermal oxide film (a buried oxide film) of 30 nm was formed on the bonded face side by performing thermal oxidation, after ion implantation of hydrogen had been performed, it was bonded with a base wafer consisting of a silicon single crystal wafer of 300 mm in diameter, it was delaminated by heat treatment for delamination in the horizontal heat treatment furnace, and thereby 10 SOI wafers were fabricated.

Example 3

Thermal oxidation was performed on a bond wafer consisting of a silicon single crystal wafer of 300 mm in diameter the both surfaces of which had been mirror-polished to form a thermal oxide film (an initial oxide film) of 150 nm on the entire surface, it was immersed in the HF aqueous solution in a state that the oxide film on the back surface of the bond wafer had been protected by the O-ring to remove the oxide film on the bonded face side, then after reprocessing of the front surface had been performed by CMP processing, thermal oxidation was again performed to form a thermal oxide film (a buried oxide film) of 30 nm on the bonded face side, after ion-implantation (co-implantation) of hydrogen and helium had been performed, it was bonded with a base wafer consisting of a silicon single crystal wafer of 300 mm in diameter, it was delaminated by heat treatment for delamination in the horizontal heat treatment furnace, and thereby 10 SOI wafers were fabricated.

Incidentally, in co-implantation of hydrogen and helium, since implantation energies are respectively 30 keV, 50 keV, helium ions are implanted into a deeper position.

Comparative Example 1

A thermal oxide film (a buried oxide film) of 30 nm was formed on the entire surface of a bond wafer consisting of a silicon single crystal wafer of 300 mm in diameter the both surfaces of which had been mirror-polished, then after ion implantation of hydrogen had been performed without performing HF treatment and second-time thermal oxide film formation, it was bonded to a base wafer and was delaminated by heat treatment for delamination, and thereby 10 SOI wafers were fabricated.

Comparative Example 2

A thermal oxide film (a buried oxide film) of 30 nm was formed on the entire surface of a bond wafer consisting of a silicon single crystal wafer of 300 mm in diameter the both surfaces of which had been mirror-polished, then after ion implantation (co-implantation) of hydrogen and helium had been performed without performing HF treatment and second-time thermal oxide film formation, it was bonded to a base wafer and was delaminated by heat treatment for delamination, and thereby 10 SOI wafers were fabricated.

Incidentally, in co-implantation of hydrogen and helium, since implantation energies are respectively 30 keV, 50 keV, helium ions are implanted into a deeper position.

Manufacturing conditions of the SOI wafers of the examples 1 to 3 and the comparative examples 1, 2, warped shapes of the bond wafers after delamination and the SOI wafers thereof, results of the scratches and the SOI film thickness abnormality thereof were shown on Table 1.

Incidentally, the warped shapes (concave and convex) show shapes based on the delaminating plane.

TABLE 1

|  | Example 1 | Example 2 | Example 3 | Comparative Example 1 | Comparative Example 2 |
|---|---|---|---|---|---|
| Reclaiming frequency | 0 | 1 | 0 | 0 | 0 |
| Initial oxide film thickness | 150 nm | 155 nm | 150 nm | None | None |
| Back surface oxide film thickness (when bonded) | 155 nm | 160 nm | 155 nm | 30 nm | 30 nm |
| Buried oxide film | 30 nm | 30 nm | 30 nm | 30 nm | 30 nm |
| H-ion implantation | 30 keV, $5 \times 10^{16}$ cm$^{-2}$ | 30 keV, $5 \times 10^{16}$ cm$^{-2}$ | 30 keV, $1.5 \times 10^{16}$ cm$^{-2}$ | 30 keV, $5 \times 10^{16}$ cm$^{-2}$ | 30 keV, $1.5 \times 10^{16}$ cm$^{-2}$ |
| He-ion implantation | None | None | 50 keV, $1 \times 10^{16}$ cm$^{-2}$ | None | 50 keV, $1 \times 10^{16}$ cm$^{-2}$ |
| Bonding process | Room temperature | Room temperature | Room temperature | Room temperature | Room temperature |
| Heat treatment for delamination | 500° C., 30 min | 500° C., 30 min | 500° C., 30 min | 500° C., 30 min | 500° C., 30 min |
| Warp of bond wafer after delamination | Concave 20 μm | Concave 21 μm | Concave 20 μm | Concave 15 μm | Convex 40 μm |
| Warp of SOI wafer | Convex 20 μm | Convex 20 μm | Convex 20 μm | Convex 20 μm | Convex 20 μm |
| Scratches | None | None | None | None | Generated on 5 wafers |
| SOI film thickness abnormality | None | None | None | Generated on 2 wafers | Generated on all wafers |

Figure 2:
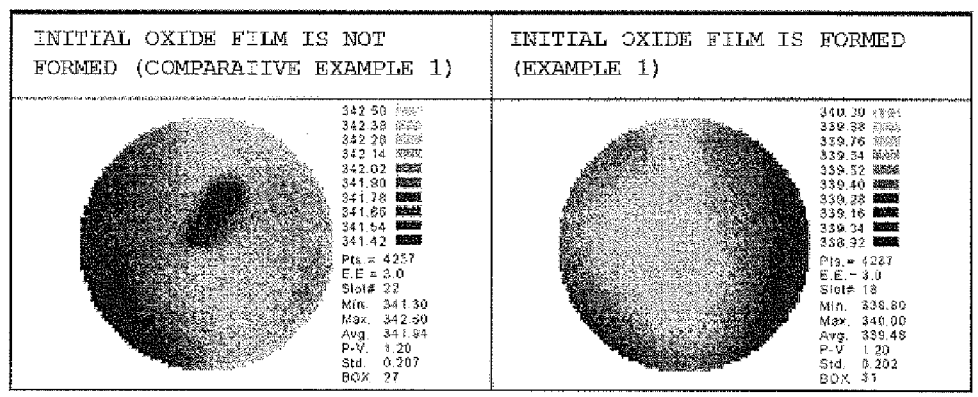
FIG. 2 is a diagram showing results of measurement of SOI layer film thickness distributions after delamination in an example 1 and a comparative example 1.
Figure 3:
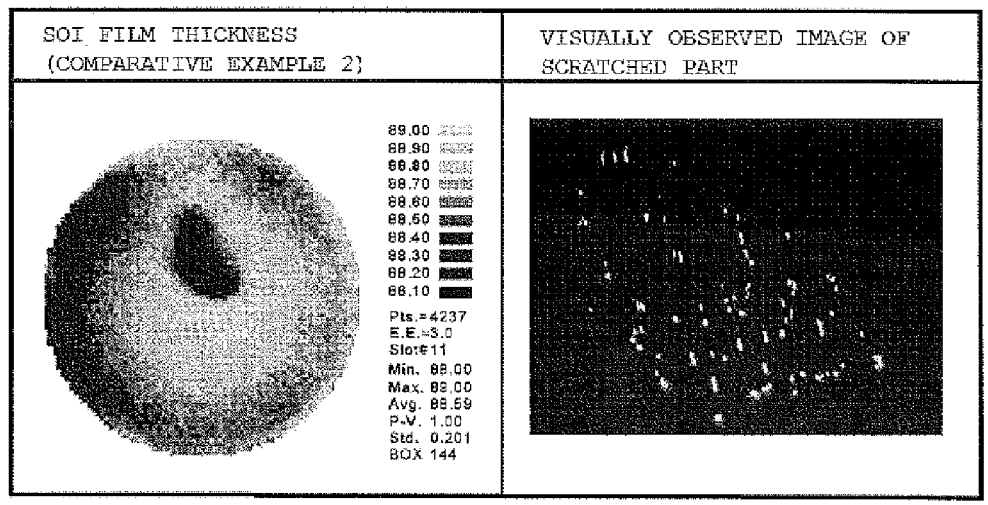
FIG. 3 is a diagram showing SOI film thickness abnormality and scratches generated on a central part of an SOI wafer of a comparative example 2.

In the examples 1 to 3, the magnitudes of the warps of the bond wafers after delamination and the SOI wafers were almost the same as one another and the scratches and the SOI film thickness abnormality were not generated (see FIG. 2). In the comparative example 1, the warp of the SOI wafer became large relative to the warp of the bond wafer after delamination and the SOI film thickness abnormality was generated (see FIG. 2). In the comparative example 2, the warp of the bond wafer after delamination became greatly convex relative to the warp of the SOI wafer and the SOI film thickness abnormality was generated, and further when an observation by optical microscope had been made, the scratches (the scratched part) were observed on the thin film part of the SOI layer (see FIG. 3).

From the results, it was revealed that the scratches on the SOI wafer and the SOI film thickness distribution abnormality caused by contact of the bond wafer after delamination with the SOI wafer can be suppressed upon delamination by the method for manufacturing SOI wafer in the present invention.

Incidentally, the present invention is not limited to the embodiments. The embodiments are illustrative and ones having configurations that are substantially the same as the technical ideas described in the scope of patent claims of the present invention and exhibiting the same operational effects are included in the technical scope of the present invention whatever they may be.

The invention claimed is:

1. In a method for manufacturing SOI wafer comprising forming an oxide film on a bond wafer consisting of a semiconductor single crystal substrate, forming an ion implanted layer into the bond wafer by implanting ions of at least one gas selected from hydrogen and rare gases through the oxide film, bonding together an ion implanted front surface of the bond wafer and a base wafer front surface via the oxide film, thereafter delaminating the bond wafer along the ion implanted layer, and thereby fabricating an SOI wafer, wherein before bonding, the oxide film to be formed on the bond wafer is made such that the oxide film on a back surface is made thicker than the oxide film on a bonded face, and after implanting ions into the bond wafer which has the thicker film on the back surface, the bond wafer and the base wafer are bonded.

2. The method for manufacturing SOI wafer according to claim 1, wherein formation of the oxide film on the bond wafer is performed by forming a thermal oxide film on the entire surface of the bond wafer, thereafter fabricating the bond wafer having the thermal oxide film only on the back surface by removing the thermal oxide on the bonded face side of the bond wafer, and thermally oxidizing the entire surface of the bond wafer having the thermal oxide film only on the back surface.

3. The method for manufacturing SOI wafer according to claim 2, wherein a process of polishing the bonded face side after the thermal oxide film on the bonded face side of the bond wafer has been removed is included, and thereafter thermal oxidation of the entire surface is performed.

4. The method for manufacturing SOI wafer according to claim 1, wherein as the bond wafer, a wafer which has been fabricated by reclaiming the bond wafer after delamination along the ion implanted layer is used.

5. The method for manufacturing SOI wafer according to claim 2, wherein as the bond wafer, a wafer which has been fabricated by reclaiming the bond wafer after delamination along the ion implanted layer is used.

6. The method for manufacturing SOI wafer according to claim 3, wherein as the bond wafer, a wafer which has been fabricated by reclaiming the bond wafer after delamination along the ion implanted layer is used.

7. The method for manufacturing SOI wafer according to claim 4, wherein in the reclaiming, the back surface oxide film of the bond wafer after delamination is not removed.

8. The method for manufacturing SOI wafer according to claim 5, wherein in the reclaiming, the back surface oxide film of the bond wafer after delamination is not removed.

9. The method for manufacturing SOI wafer according to claim 6, wherein in the reclaiming, the back surface oxide film of the bond wafer after delamination is not removed.

10. The method for manufacturing SOI wafer according to claim 1, wherein as the ion implantation, co-implantation of hydrogen ions and helium ions is performed, and in the co-implantation, the helium ions are implanted into a position deeper than that of the hydrogen ions.

11. The method for manufacturing SOI wafer according to claim 2, wherein as the ion implantation, co-implantation of hydrogen ions and helium ions is performed, and in the co-implantation, the helium ions are implanted into a position deeper than that of the hydrogen ions.

12. The method for manufacturing SOI wafer according to claim 3, wherein as the ion implantation, co-implantation of hydrogen ions and helium ions is performed, and in the co-implantation, the helium ions are implanted into a position deeper than that of the hydrogen ions.

13. The method for manufacturing SOT wafer according to claim 4, wherein as the ion implantation, co-implantation of hydrogen ions and helium ions is performed, and in the co-implantation, the helium ions are implanted into a position deeper than that of the hydrogen ions.

14. The method for manufacturing SOI wafer according to claim 5, wherein as the ion implantation, co-implantation of hydrogen ions and helium ions is performed, and in the co-implantation, the helium ions are implanted into a position deeper than that of the hydrogen ions.

15. The method for manufacturing SOI wafer according to claim 6, wherein as the ion implantation, co-implantation of hydrogen ions and helium ions is performed, and in the co-implantation, the helium ions are implanted into a position deeper than that of the hydrogen ions.

16. The method for manufacturing SOI wafer according to claim 7, wherein as the ion implantation, co-implantation of hydrogen ions and helium ions is performed, and in the co-implantation, the helium ions are implanted into a position deeper than that of the hydrogen ions.

17. The method for manufacturing SOI wafer according to claim 8, wherein as the ion implantation, co-implantation of hydrogen ions and helium ions is performed, and in the co-implantation, the helium ions are implanted into a position deeper than that of the hydrogen ions.

18. The method for manufacturing SOT wafer according to claim 9, wherein as the ion implantation, co-implantation of hydrogen ions and helium ions is performed, and in the co-implantation, the helium ions are implanted into a position deeper than that of the hydrogen ions.

* * * * *